United States Patent
Wang et al.

(10) Patent No.: US 11,990,781 B2
(45) Date of Patent: May 21, 2024

(54) METHOD FOR DETERMINING A QUALITY FACTOR AND WIRELESS CHARGER

(71) Applicant: NXP USA, Inc., Austin, TX (US)

(72) Inventors: Dechang Wang, Suzhou (CN); Dengyu Jiang, Suzhou (CN); Ruyang Sheng, Suzhou (CN); Huan Mao, Suzhou (CN)

(73) Assignee: NXP USA, Inc., Austin, TX (US)

( * ) Notice: Subject to any disclaimer, the term of this patent is extended or adjusted under 35 U.S.C. 154(b) by 122 days.

(21) Appl. No.: 17/104,163

(22) Filed: Nov. 25, 2020

(65) Prior Publication Data
US 2021/0175728 A1    Jun. 10, 2021

(30) Foreign Application Priority Data
Dec. 6, 2019 (CN) .......................... 201911254542.0

(51) Int. Cl.
*H02J 7/00* (2006.01)
*G01R 27/26* (2006.01)
*H02J 7/04* (2006.01)
*H02J 50/12* (2016.01)

(52) U.S. Cl.
CPC ........ *H02J 7/0047* (2013.01); *G01R 27/2688* (2013.01); *H02J 7/04* (2013.01); *H02J 50/12* (2016.02); *H02J 2207/20* (2020.01)

(58) Field of Classification Search
CPC .................................................... G01R 27/26
See application file for complete search history.

(56) References Cited

U.S. PATENT DOCUMENTS

| | | | |
|---|---|---|---|
| 5,420,518 A | 5/1995 | Schafer, Jr. | |
| 6,471,106 B1 | 10/2002 | Reining | |
| 8,093,758 B2* | 1/2012 | Hussmann | H02J 50/12 307/145 |
| 8,983,374 B2 | 3/2015 | Wiley | |
| 9,178,387 B2 | 11/2015 | Mohammadian et al. | |
| 9,316,674 B2* | 4/2016 | Baldischweiler | G01R 29/10 |
| 9,450,648 B2 | 9/2016 | Bastami | |
| 9,465,064 B2 | 10/2016 | Roy et al. | |
| 9,474,031 B1 | 10/2016 | Sedzin et al. | |

(Continued)

FOREIGN PATENT DOCUMENTS

| | | |
|---|---|---|
| CN | 102598521 A | 7/2012 |
| CN | 103852631 A | 6/2014 |

(Continued)

*Primary Examiner* — Drew A Dunn
*Assistant Examiner* — Tynese V McDaniel

(57) ABSTRACT

A method for determining a quality factor of a wireless charger is disclosed. The wireless charger includes an inverter, a filter, and a resonant tank circuit. The inverter receives a supply voltage and generates a PWM signal at a first node and a second node. The filter connects to the first and second nodes of the inverter to receive the PWM signal, and generates a filtered signal at a first terminal and a second terminal of a capacitor. The resonant tank circuit connects to the first and second terminals of the capacitor of the filter to receive the filtered signal, and provides wireless power at an inductor coil to a receiver. The method includes: issuing a current pulse to the resonant tank circuit; and in a Q-factor determination phase of the wireless charger, connecting the resonant tank circuit and only the capacitor of the filter in a resonance network.

20 Claims, 7 Drawing Sheets

(56) References Cited

U.S. PATENT DOCUMENTS

| | | |
|---|---|---|
| 9,530,558 B2 | 12/2016 | Nakano et al. |
| 9,806,542 B2 | 10/2017 | Asanuma et al. |
| 9,851,399 B2 | 12/2017 | Finkenzeller et al. |
| 9,966,803 B2 | 5/2018 | Wang et al. |
| 10,218,211 B2 | 2/2019 | Li et al. |
| 10,283,995 B2 | 5/2019 | Gunderson |
| 10,763,706 B2 | 9/2020 | Chen et al. |
| 11,218,026 B1* | 1/2022 | Hansen ............... B60L 53/12 |
| 11,316,383 B1* | 4/2022 | Terry .................. H02J 50/12 |
| 2003/0141845 A1* | 7/2003 | Krieger ............... H02J 7/342 |
| | | 320/132 |
| 2004/0189215 A1 | 9/2004 | Chen |
| 2008/0197804 A1 | 8/2008 | Onishi et al. |
| 2009/0021219 A1 | 1/2009 | Yoda et al. |
| 2012/0326773 A1* | 12/2012 | Posat ............... H01L 23/5227 |
| | | 327/552 |
| 2013/0069441 A1 | 3/2013 | Verghese et al. |
| 2013/0094598 A1* | 4/2013 | Bastami ............... H02J 50/80 |
| | | 375/259 |
| 2013/0154557 A1 | 6/2013 | Lee et al. |
| 2013/0188397 A1* | 7/2013 | Wu ..................... H02J 50/10 |
| | | 363/17 |
| 2013/0257165 A1 | 10/2013 | Singh |
| 2013/0257168 A1 | 10/2013 | Singh |
| 2013/0272044 A1* | 10/2013 | Boys .................. H02M 7/06 |
| | | 363/126 |
| 2013/0314035 A1* | 11/2013 | Kohlschmidt ....... H04B 5/0087 |
| | | 320/108 |
| 2014/0001879 A1 | 1/2014 | Van Wageningen |
| 2014/0015329 A1 | 1/2014 | Widmer et al. |
| 2014/0015522 A1 | 1/2014 | Widmer et al. |
| 2014/0028110 A1* | 1/2014 | Petersen ............... H02J 50/12 |
| | | 307/104 |
| 2014/0049422 A1* | 2/2014 | Von Novak ........... H02J 50/60 |
| | | 342/146 |
| 2014/0084857 A1* | 3/2014 | Liu ..................... H02J 7/0029 |
| | | 320/108 |
| 2014/0111019 A1 | 4/2014 | Roy et al. |
| 2014/0125287 A1* | 5/2014 | Nakano ............... H02J 50/80 |
| | | 307/104 |
| 2014/0239735 A1 | 8/2014 | Abe et al. |
| 2014/0239736 A1* | 8/2014 | Kai ..................... H04B 5/0037 |
| | | 307/104 |
| 2014/0247004 A1 | 9/2014 | Kari et al. |
| 2014/0319924 A1* | 10/2014 | Jung ................... H04B 5/0037 |
| | | 307/104 |
| 2014/0333145 A1 | 11/2014 | Lee et al. |
| 2014/0361738 A1 | 12/2014 | Lee et al. |
| 2015/0162779 A1 | 6/2015 | Lee et al. |
| 2015/0198640 A1 | 7/2015 | Lee |
| 2015/0244177 A1* | 8/2015 | Budgett ............... H02J 50/12 |
| | | 320/108 |
| 2015/0318708 A1* | 11/2015 | Bartlett ............... H02J 50/12 |
| | | 307/104 |
| 2015/0318730 A1 | 11/2015 | Bhargava et al. |
| 2015/0326031 A1* | 11/2015 | Yamaguchi ........... H02J 7/025 |
| | | 307/104 |
| 2015/0341085 A1* | 11/2015 | Ettes .................. H02J 50/50 |
| | | 307/104 |
| 2015/0372493 A1* | 12/2015 | Sankar ................. H02J 50/10 |
| | | 307/104 |
| 2016/0028248 A1* | 1/2016 | Asanuma .............. H02J 50/60 |
| | | 307/104 |
| 2016/0134131 A1* | 5/2016 | Murayama ............ H02J 7/025 |
| | | 307/104 |
| 2016/0146886 A1* | 5/2016 | Finkenzeller ........ G01R 31/315 |
| | | 324/603 |
| 2016/0181871 A1* | 6/2016 | Krumme ............... A61B 6/03 |
| | | 307/104 |
| 2016/0190852 A1 | 6/2016 | Chiang et al. |
| 2016/0268842 A1* | 9/2016 | Wang .................... H02J 9/005 |
| 2016/0336809 A1 | 11/2016 | Gluzman et al. |
| 2017/0005523 A1* | 1/2017 | Widmer ............... B60L 53/38 |
| 2017/0098149 A1* | 4/2017 | Kesler ................. H02J 50/80 |
| 2017/0117755 A1* | 4/2017 | Muratov ............... H02J 50/12 |
| 2017/0117756 A1* | 4/2017 | Muratov ............... H02J 50/60 |
| 2017/0223637 A1 | 8/2017 | Wang et al. |
| 2017/0271908 A1* | 9/2017 | Li ....................... H02J 50/70 |
| 2018/0048162 A1* | 2/2018 | Von Novak .......... H04B 5/0031 |
| 2018/0062504 A1* | 3/2018 | Mei .................... H02M 1/4233 |
| 2018/0115197 A1 | 4/2018 | Li et al. |
| 2018/0194237 A1* | 7/2018 | Sarwat ................. H02J 50/12 |
| 2018/0219430 A1* | 8/2018 | Russell ............... H02J 50/60 |
| 2018/0219431 A1* | 8/2018 | Guillermo ............. H02J 7/025 |
| 2018/0233956 A1* | 8/2018 | Moussaoui ........... H02J 50/80 |
| 2018/0241257 A1 | 8/2018 | Muratov et al. |
| 2018/0290545 A1* | 10/2018 | Elshaer ............... B60L 53/14 |
| 2018/0304755 A1* | 10/2018 | Beaver ............... H02J 7/00034 |
| 2018/0337549 A1* | 11/2018 | Chen .................. H02J 50/10 |
| 2018/0337557 A1* | 11/2018 | Chen .................. H02J 7/025 |
| 2018/0342899 A1* | 11/2018 | Joye .................. H02J 50/80 |
| 2019/0109499 A1* | 4/2019 | Smith ................. H02J 50/60 |
| 2019/0140489 A1* | 5/2019 | Liu .................... H02J 50/60 |
| 2019/0217726 A1* | 7/2019 | Covic ................. H01F 38/14 |
| 2019/0260232 A1* | 8/2019 | Liu .................... H02M 3/337 |
| 2019/0272943 A1* | 9/2019 | Leem .................. H02J 7/02 |
| 2019/0312459 A1* | 10/2019 | Garbus ............... H02J 50/80 |
| 2019/0319494 A1* | 10/2019 | Park ................... G01N 27/02 |
| 2019/0326782 A1* | 10/2019 | Graham ............... H01F 27/28 |
| 2019/0356169 A1* | 11/2019 | Misawa ............. H02M 3/33573 |
| 2020/0076246 A1* | 3/2020 | Fukuzawa ............ G01V 3/101 |
| 2020/0185974 A1* | 6/2020 | Chen .................. H02M 7/5387 |
| 2020/0212713 A1* | 7/2020 | Jiang .................. H02J 50/60 |
| 2021/0135506 A1* | 5/2021 | Muratov ............... H02J 50/12 |
| 2021/0167637 A1* | 6/2021 | Schwartz ............. H02J 50/70 |
| 2021/0175728 A1 | 6/2021 | Wang et al. |
| 2021/0194284 A1* | 6/2021 | Van Wageningen ........................ H04B 5/0037 |
| 2021/0234366 A1* | 7/2021 | Danilovic ............. H02M 1/08 |
| 2021/0273492 A1* | 9/2021 | Sherman .............. H04B 17/11 |
| 2021/0359550 A1* | 11/2021 | Budgett ............... H04B 5/0056 |
| 2022/0069570 A1* | 3/2022 | Hegde ................. H02J 50/10 |
| 2022/0069627 A1* | 3/2022 | Cimaz ................ H04B 5/0037 |
| 2022/0103015 A1* | 3/2022 | Nussbaum ........ H02M 3/33584 |
| 2022/0166255 A1* | 5/2022 | Wu ..................... H02J 50/12 |
| 2022/0209587 A1* | 6/2022 | Kavimandan ......... H02J 50/90 |

FOREIGN PATENT DOCUMENTS

| | | |
|---|---|---|
| CN | 102823101 A | 6/2015 |
| CN | 105075066 A | 11/2015 |
| CN | 205027804 U | 2/2016 |
| CN | 103053093 A | 9/2017 |
| CN | 111313569 A | 6/2020 |
| DE | 2443069 A1 | 3/1975 |
| JP | 2015233410 A | 12/2015 |
| TW | 200919901 A | 5/2009 |

* cited by examiner

METHOD FOR DETERMINING A QUALITY FACTOR AND WIRELESS CHARGER

CROSS-REFERENCE TO RELATED APPLICATIONS

This application claims the priority under 35 U.S.C. § 119 of China application no. 201911254542.0, filed on 6 Dec. 2019, the contents of which are incorporated by reference herein.

BACKGROUND

The present disclosure generally relates to a method for detecting a quality factor (Q-factor) and a wireless charger. More particularly, the present disclosure relates to a wireless charger having a complex resonant tank circuit and a method for detecting the Q-factor of the wireless charger with the complex resonant tank circuit.

Quality factor (Q-factor) can be used in wireless chargers to determine if an unfriendly foreign object (i.e., a metal object) is present in its charging area, so to avoid the charger from heating up the foreign object and causing damages. Typically, Q-factor is defined as a pole with respect to a resonant frequency band. A signal with a sweeping frequency is applied to the resonant tank circuit of the charger to determine the Q-factor as the largest ratio of $V_{resonant}/V_{drive}$ over the sweeping frequency range, where $V_{resonant}$ is the signal voltage on a transmitter coil, and $V_{drive}$ is the signal voltage applied to the resonant tank circuit. While this method is readily performed on low power charging systems, which use a series LC resonant circuit, it cannot be easily performed in charging systems that use a more complex resonant circuit. For example, in automotive applications, complex resonant tank circuits are used to meet Electro-Magnetic Compatibility (EMC) requirements. The complex resonant circuits cause the system to have multiple poles, making it difficult to determine the Q-factor.

It would be advantageous to have a method and an apparatus for determining a Q-factor in a wireless charger having a complex resonant tank circuit.

SUMMARY

This summary is provided to introduce a selection of concepts in a simplified form that are further described below in the Detailed Description. This summary is not intended to identify key or essential features of the claimed subject matter, nor is it intended to be used to limit the scope of the claimed subject matter.

In one embodiment, the present disclosure provides a method for determining a quality factor of a wireless charger. The wireless charger includes an inverter, a filter, and a resonant tank circuit. The inverter receives a supply voltage and generates a PWM signal by switching first, second, third, and fourth switches of the inverter. The filter connects to the inverter and receives the PWM signal and generates a filtered signal. The resonant tank circuit connects to the filter and receives the filtered signal, and provides wireless power to a receiver. The method includes: closing one of the first and the second switches, and one of the third and fourth switches, to issue a current pulse to the resonant tank circuit; and opening the first to fourth switches in a Q-factor determination phase of the wireless charger. The Q-factor determination phase may extend only whilst all four switches are open (single-pole resonance state), or may encompass the single pole resonance state when all four switches are open, together with the prior state when one of the first and the second switches is closed, along with one of the third and fourth switches (current pulse, also known as tank-priming, state).

In another embodiment, the present disclosure provides a method for determining a quality factor of a wireless charger. The wireless charger includes an inverter, a filter, and a resonant tank circuit. The inverter receives a supply voltage and generates a PWM signal at a first node and a second node. The filter connects to the first and second nodes of the inverter to receive the PWM signal, and generates a filtered signal at a first terminal and a second terminal of a capacitor. The resonant tank circuit connects to the first and second terminals of the capacitor of the filter to receive the filtered signal, and provides wireless power at an inductor coil to a receiver. The method includes: issuing a current pulse to the resonant tank circuit; and in a Q-factor determination phase of the wireless charger, connecting the resonant tank circuit and only the capacitor of the filter in a resonance network.

In another embodiment, the present disclosure provides a wireless charger. The wireless charger includes an inverter, a filter, a resonant tank circuit, and a controller. The inverter receives a supply voltage from a voltage supply and generates a PWM signal. The inverter includes a first branch and a second branch that are connected in parallel between the voltage supply and ground. The first branch includes first and second series connected switches. The second branch includes third and fourth series connected switches. The filter is connected to the inverter for receiving the PWM signal, and generates a filtered signal. The filter includes a capacitor and an inductor connected to the capacitor. The resonant tank circuit is connected across the capacitor of the filter for receiving the filtered signal. The resonant tank circuit provides wireless power to a receiver located within a charging area of the wireless charger. The controller is connected to the first to fourth switches of the inverter. The controller closes one of the first and the second switches, and one of the third and fourth switches, to issue a current pulse to the resonant tank circuit. The controller opens the first to fourth switches during a Q-factor determination phase of the wireless charger.

BRIEF DESCRIPTION OF THE DRAWINGS

So that the manner in which the above recited features of the present disclosure can be understood in detail, a more detailed description is given below, with reference to embodiments, some of which are illustrated in the appended drawings. The appended drawings illustrate only typical embodiments of the disclosure and should not be interpreted as limiting the scope of the disclosure, as the disclosure may have other embodiments, which may be equally effective. The drawings are for facilitating an understanding of the disclosure and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
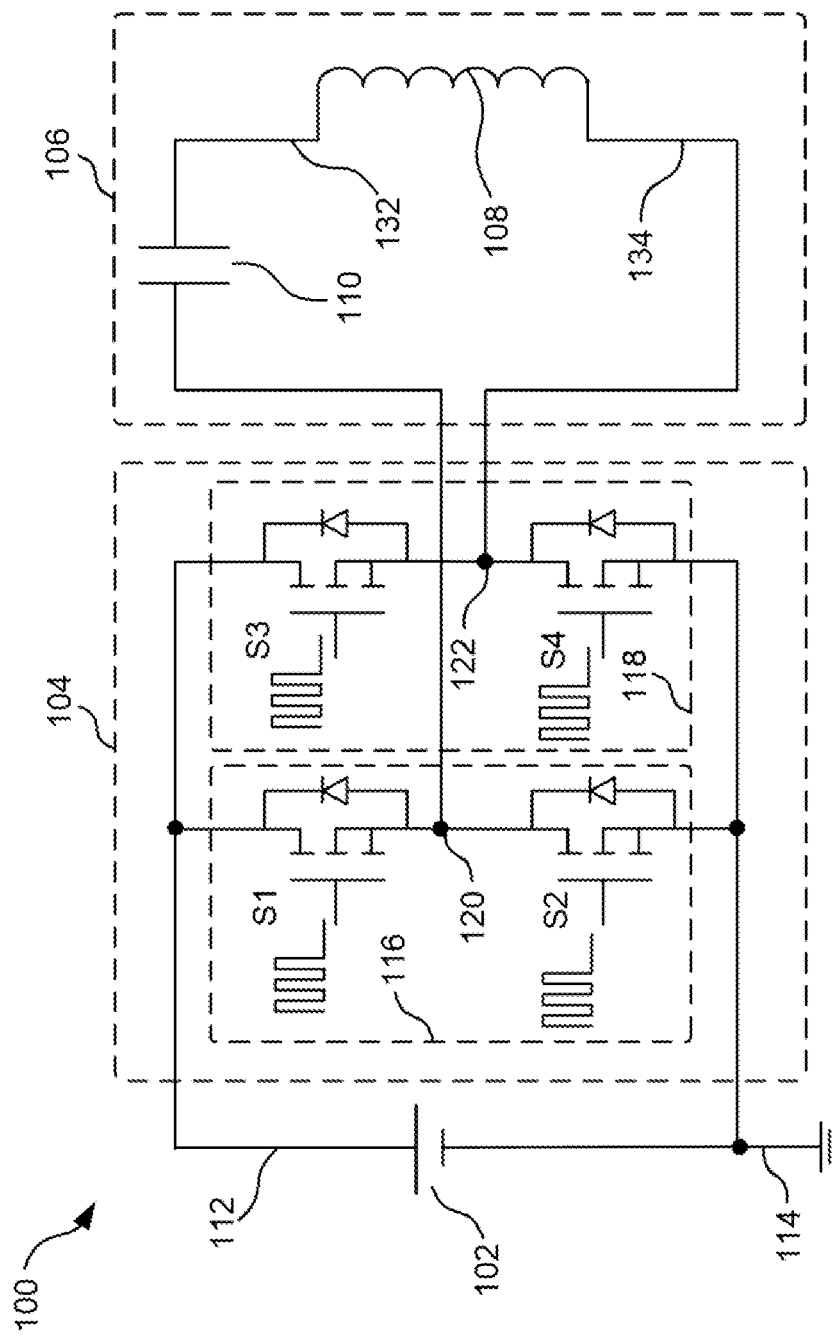
FIG. 1 is a circuit diagram of a wireless charger in a normal operation phase.

FIG. 1 is a circuit diagram of a wireless charger 100. The wireless charger 100 includes a voltage supply 102, an inverter 104, and a resonance tank 106. The voltage supply 102 provides a supply voltage at an output terminal 112. The supply voltage from the voltage supply 102 is a DC voltage. The inverter 104, also named a power inverter, converts the DC voltage into an AC signal, and provides the AC signal to the resonant tank 106.

The inverter 104 is a full-bridge type inverter which includes a first branch 116 and a second branch 118. The first and second branches 116 and 118 are connected in parallel between the output terminal 112 of the voltage supply 102 and ground 114. More particularly, the first branch 116 includes first and second series connected switches S1 and S2, where a first terminal of the first switch S1 receives the DC supply voltage from the output terminal 112 and a terminal of the second switch S2 is connected to the ground 114. The second branch 118 includes third and fourth series connected switches S3 and S4, where a first terminal of the third switch S3 receives the DC supply voltage from the output terminal 112 and a terminal of the fourth switch S4 is connected to the ground 114. The inverter 104 has a first output terminal 120 and a second output terminal 122 that provide the converted AC signal to the resonance tank 106. The first output terminal 120 is connected to a node between the first and second switches S1 and S2, and the second output terminal 122 is connected to a node between the third and fourth switches S3 and S4.

As shown by the signal diagrams next to each of the switches S1 to S4 in FIG. 1, in a normal operation phase, for example in a charging activity, in the first branch 116, the first and second switches S1 and S2 are controlled by a controller (not shown) to be alternately closed. Similarly, in the second branch 118, the third and fourth switches S3 and S4 are controlled by the controller to be alternately closed. The switches S1 and S2, or the switches S3 and S4, are not closed simultaneously to avoid shorting the voltage supply 102. The switches S1 through S4 are shown as MOSFETs each having a gate terminal to receive the control signal from the controller, however the switches can be implemented to be other types of device which are controllable to be conductive.

The resonant tank circuit 106 is connected to the inverter 104 to receive the AC signal. To be more specific, the resonant tank circuit 106 is connected to the first output terminal 120 and the second output terminal 122 to receive the AC signal. The resonant tank circuit 106 includes an inductor coil 108 which radiates power, and a capacitor 110 series connected with the inductor coil 108. The inductor coil 108 of the resonant tank circuit 106 has a first terminal 132 coupled to the first output terminal 120 of the inverter 104 by way of a series connected capacitor 110, and a second terminal 134 coupled to the second output terminal 122 of the inverter 104.

The radiated power may be used to charge a receiver device that is placed proximate the wireless charger 100, i.e. within a charging area of the wireless charger 100. The AC signal drives the inductor coil 108 to generate a magnetic field. The magnetic field causes a receiver coil in a receiver device to generate an induced current, thereby transfers power from the charger to the receiver. As understood, the magnetic field attenuates with an increasing distance, the charging area of the wireless charger 100 is an area where the generated magnetic field is strong enough to cause a required current to be induced in the receiver device, for example within a distance from the inductor coil 108, which distance being dependent on the AC signal for driving the inductor coil 108, and the inductance of the inductor coil 108, etc.

Figure 2:
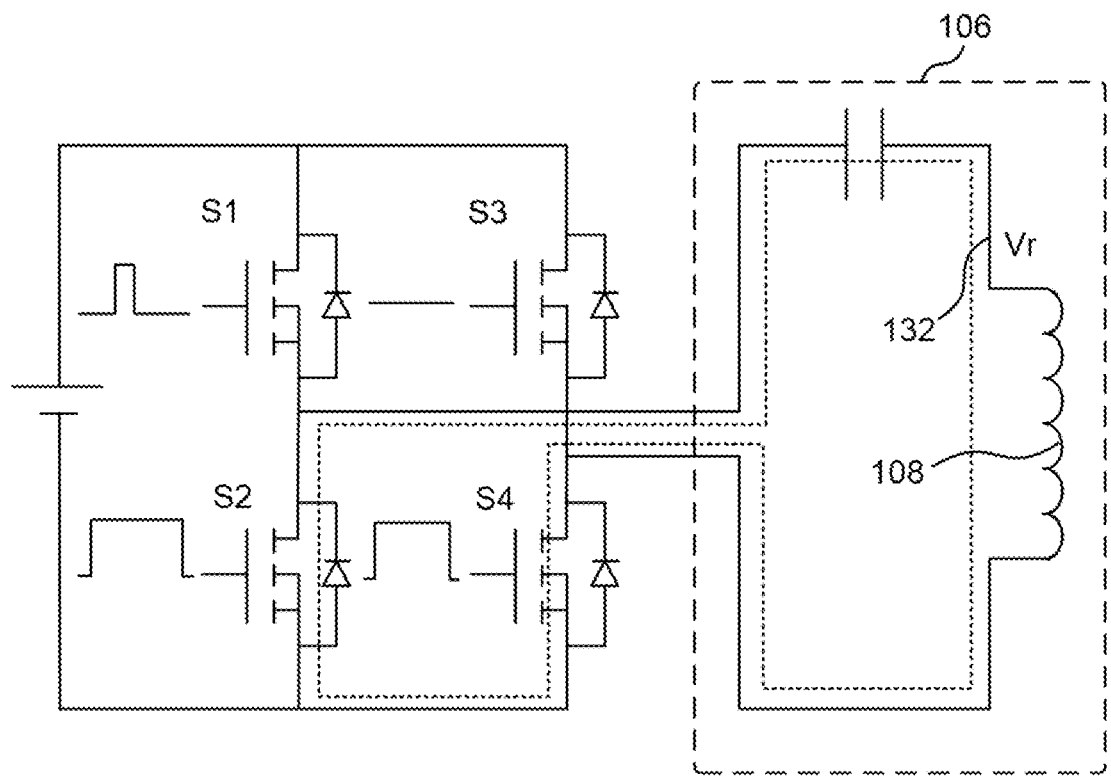
FIG. 2 is a circuit diagram of the wireless charger of FIG. 1 in a Q-factor determination phase.

As understood by those of skill in the art, Q-factor is used in one method of detecting the presence of a foreign object (FO) within the charging area of the wireless charger 100. Referring to FIG. 2, the signal diagrams next to the switches S1 to S4 are control signals applied to the corresponding switches in a Q-factor determination phase. The first switch S1 is closed for a short time to issue an exciting current into the resonant tank circuit 106. After that, the switches S2 of the first branch 116 and S4 of the second branch 118 are closed, while the switches S1 and S3 are open, the resonant tank circuit 106 is connected as a free resonant tank as indicated by the dotted lines in FIG. 2, and accordingly enters a free resonant status.

Figure 3:
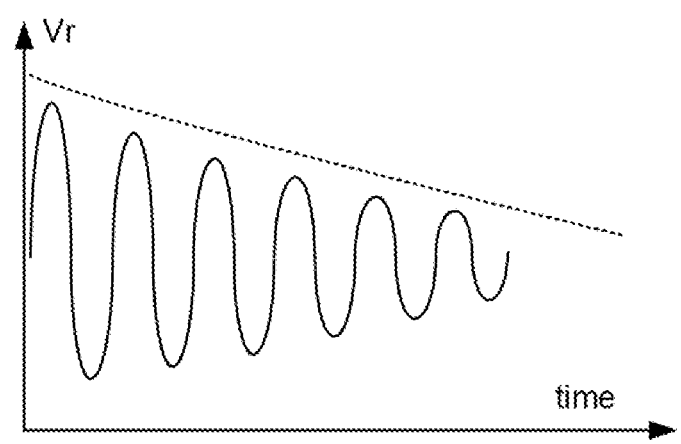
FIG. 3 is a signal diagram of a resonant voltage of the inductor coil of FIG. 1.

Typically, Q-factor is defined as describing how fast an energy stored in the resonant tank circuit 106 is damped due to the internal energy loss of the resonant tank circuit 106. If an FO is present, the stored energy by the resonant tank circuit 106 fluctuates, and accordingly the Q-factor becomes different as compared to the absence of the FO. For simplicity, a resonant voltage $V_r$ of the inductor coil 108 at its first terminal 132 indicative the stored energy of the resonant tank circuit 106 is measured to determine the Q-factor. As the switches S2 and S4 are closed, it is now able to determine a resonant voltage $V_r$ of the inductor coil 108 at its first terminal 132. FIG. 3 shows the resonant voltage $V_r$ of the inductor coil 108 of FIG. 2 over time.

Figure 4:
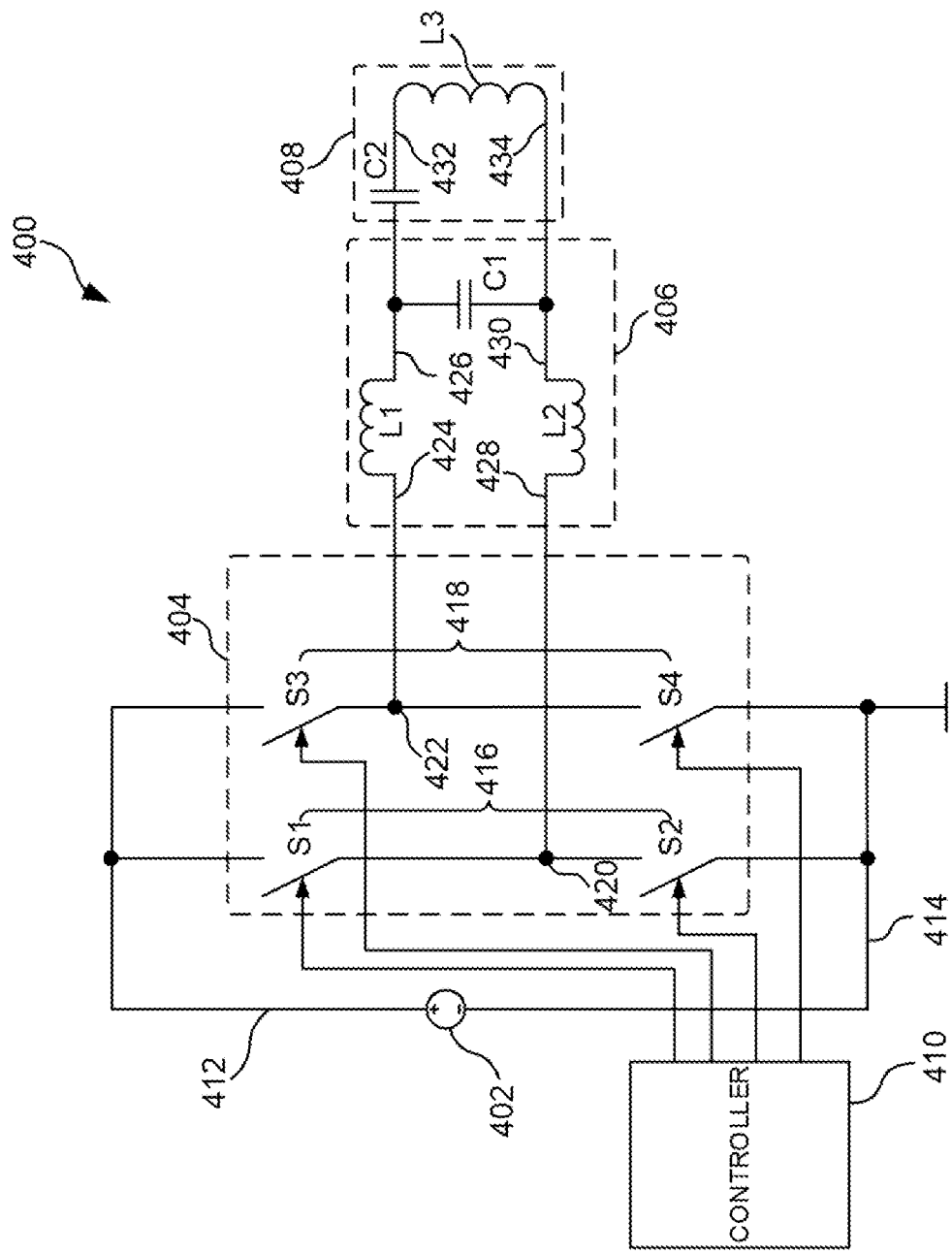
FIG. 4 is a circuit diagram of a wireless charger according to an embodiment.

FIG. 4 is a circuit diagram of a wireless charger 400 operable according to an embodiment of the present disclosure. The wireless charger 400 includes a voltage supply 402, an inverter 404, a filter 406, a resonant tank circuit 408 and a controller 410. The voltage supply 402, the inverter 404, and the resonant tank circuit 408 of the wireless charger 400 in FIG. 4 are similar to the voltage supply 102, the inverter 104, and the resonant tank circuit 106 of the wireless charger 100 of FIG. 1, and will be described in general herein.

The voltage supply 402 provides a DC supply voltage at an output terminal 412. The inverter 404 converts the DC voltage into an AC signal, and provides the AC signal to the filter 406.

Similar to the inverter 104 of FIG. 1, the inverter 404 of FIG. 4 is a full-bridge type inverter which includes a first branch 416 and a second branch 418. The first and second branches 416 and 418 are connected in parallel between the output terminal 412 of the voltage supply 402 and ground 414. More particularly, the first branch 416 includes first and second series connected switches S1 and S2, where a first terminal of the first switch S1 receives the DC supply voltage from the output terminal 412 and a terminal of the second switch S2 is connected to the ground 414. The second branch 418 includes third and fourth series connected switches S3 and S4, where a first terminal of the third switch S3 receives the DC supply voltage from the output terminal 412 and a terminal of the fourth switch S4 is connected to the ground 414. The inverter 404 has a first output terminal 420 and a second output terminal 422 that provide the converted AC signal to the filter 406. The first output terminal 420 is connected to a node between the first and second switches S1 and S2, and the second output terminal 422 is connected to a node between the third and fourth switches S3 and S4.

In normal operation, for example in a charging activity, in the first branch 416, the first and second switches S1 and S2 are controlled by the controller 410 to be alternately closed. Similarly, in the second branch 418, the third and fourth switches S3 and S4 are controlled by the controller 410 to be alternately closed. The switches S1 and S2, or the switches S3 and S4, are not closed simultaneously to avoid shorting the voltage supply 402. The result, is that the voltage across the inverter circuit output is an (square-wave) AC signal, having a frequency corresponding to the switching frequency of the switches. The switches S1 through S4 of the wireless charger 400 of FIG. 4 can be implemented as the MOSFETs as shown in FIG. 1, or can be other switches controllable to be conductive.

The filter 406 is connected to the inverter 404 to receive the AC signal via the first and second output terminals 420 and 422. The filter 406 filters the AC signal and generates a filtered PWM (pulse-width modulated) signal. In the present disclosure, the filter 406 is a PI-filter (π-filter), which includes first and second inductors L1 and L2, and a capacitor C1. The first inductor L1 is connected to the second output terminal 422 of the inverter 404, and the second inductor L2 is connected to the first output terminal 420 of the inverter 404. The first inductor L1 has a first terminal 424 connected to the second output terminal 422 of the inverter 404 and a second terminal 426 connected to the resonant tank circuit 408 and to a first terminal of the capacitor C1. Similarly, the second inductor L2 has a first terminal 428 connected to the first output terminal 420 of the inverter 404 and a second terminal 430 connected to the resonant tank circuit 408 and to a second terminal of the capacitor C1. Thus, the capacitor C1 is connected between the second terminal 426 of the first inductor L1 and the second terminal 430 of the second inductor L2. In other words, the first inductor L1 and the second inductor L2 are connected to opposite sides of the capacitor C1. According to an embodiment, the first inductor L1 and the second inductor L2 both have an inductance of 1 micro-Henry ($\mu H$), and the capacitor C1 has a capacitance of 0.4 micro-Farad ($\mu F$). In other, non-limiting embodiments, the first inductor L1 and the second inductor L2 both have an inductance in a range between of 0.1 $\mu H$ and 10 $\mu H$, and the capacitor C1 has a capacitance in a range 0.1 $\mu F$ to 2 $\mu F$.

The PI-filter 406 filters out harmonic components from the square-wave AC signal from the inverter 404 to produce a sinusoid-wave PWM signal, and provides the filtered sinewave PWM signal to the resonant tank circuit 408. In alternative embodiments, the filter 406 can include more or fewer inductors. For example, the filter 406 can be implemented as an L-type filter which, as comparing with the PI-filter 406 shown in FIG. 4, includes the capacitor C1 and only one of the first and second inductors L1 and L2. The filter 406 enables the wireless charger 400 to be suitable for applications with high power, for example 10 W-60 W power solutions. The frequency of the PWM signal, as described above, is dependent on the switching frequency of the switches S1 to S4. In applications according to the Qi protocol, the frequency of the PWM signal is between 105 kHz and 210 kHz.

Similar to the resonant tank circuit 106 of FIG. 1, the resonant tank circuit 408 of FIG. 4 is connected to the filter 406 to receive the sine-wave PWM signal. To be more specific, the PWM signal of the filter 406 is provided across the capacitor C1 at its first and second terminals (not labelled), and the resonant tank circuit 408 is connected across the capacitor C1 of the filter 406 to receive the PWM signal. The resonant tank circuit 408 includes an inductor coil L3 which radiates power. The radiated power may be used to charge a receiver device that is within the charging area of the wireless charger 400. The wireless charger 400 can also use the inductor coil L3 of the resonant tank circuit 408 to communicate with the receiver device, for example in the format of data packets according to the Qi standard.

The inductor coil L3 of the resonant tank circuit 408 has a first terminal 432 coupled to the second terminal 426 of the first inductor L1 of the filter 406, and a second terminal 434 connected to the second terminal 430 of the second inductor L2 of the filter 406. The resonant tank circuit 408 also includes a capacitor C2 connected between the second terminal 426 of the first inductor L1 of the filter 406 and the first terminal 432 of the inductor coil L3. It can be understood that the capacitor C2 is accordingly series connected with the inductor coil L3.

As described with reference to FIG. 2, in determination of the Q-factor, the first switch S1 and the fourth switch S4 are closed for a short time to issue an exciting current to trigger the resonant tank circuit 408 to oscillate. The time during which the first switch S1 and the fourth switch S4 are closed to issue such exciting current is shorter than a time the switches are closed in each cycle during the normal operation phase. After the exciting current is issued, if the wireless charger 400 operates similarly to the wireless charger 100 of FIG. 1 to close the switches S2 of the first branch 416 and S4 of the second branch 418 and open the switches S1 and S3, the voltage $V_r$ will be difficult to be measured since neither the inductor coil L3 nor the capacitor C2 is connected to ground. Instead, the inductor coil L3 and the capacitor C2 are floating.

Figure 5:
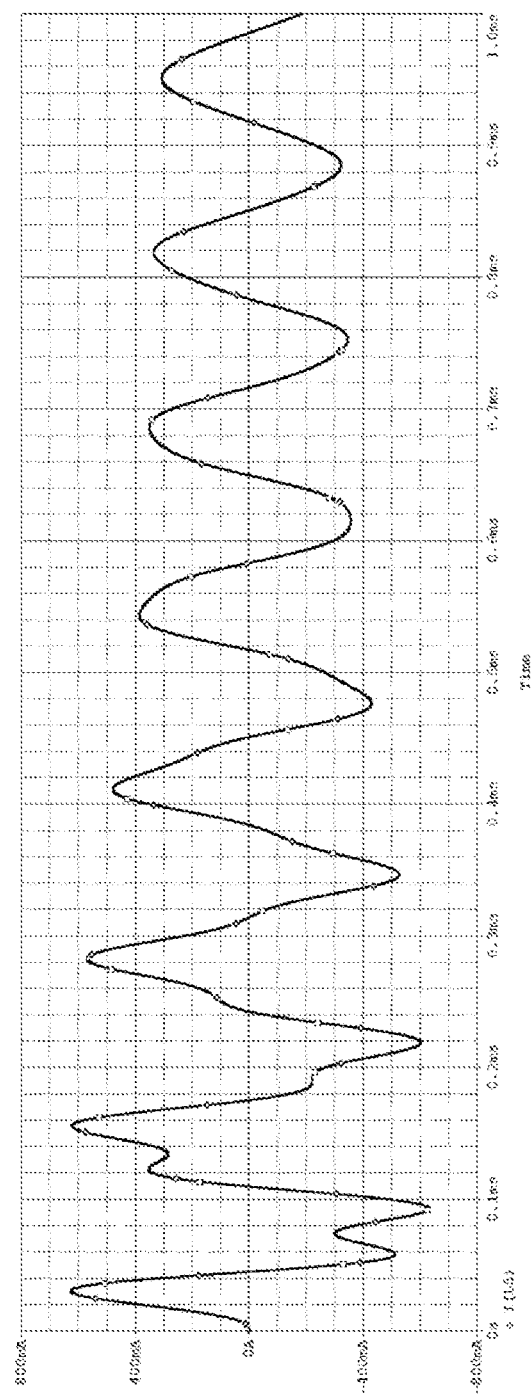
FIG. 5 is a current wave form of the inductor coil of FIG. 4 in the Q-factor determination phase, wherein the inductors of the filter are coupled into the resonance network.

Furthermore, closing switches S2 and S4 will couple not only the inductor coil L3 and the capacitor C2, but also the first inductor L1 and the second inductor L2 into a resonance network which starts resonating as triggered by the exciting current. Accordingly, these multiple resonant elements coupled into one resonance circuit will result multiple resonant frequencies of the resonance network, also referred to as "poles". Referring to FIG. 5 which is a current wave flowing through the inductor coil L3 when coupled in the resonance network including the first and second inductors L1 and L2, the signal wave is complicated and includes harmonic components, causing it difficult to determine the Q-factor. These harmonic components are particularly visible towards the left of the plot, at the start of the resonance, although it will be noted that they appear to damp out quicker than the fundamental resonance, such that the right side of the plot resembles a single harmonic, or single-pole, resonance.

Figure 6:
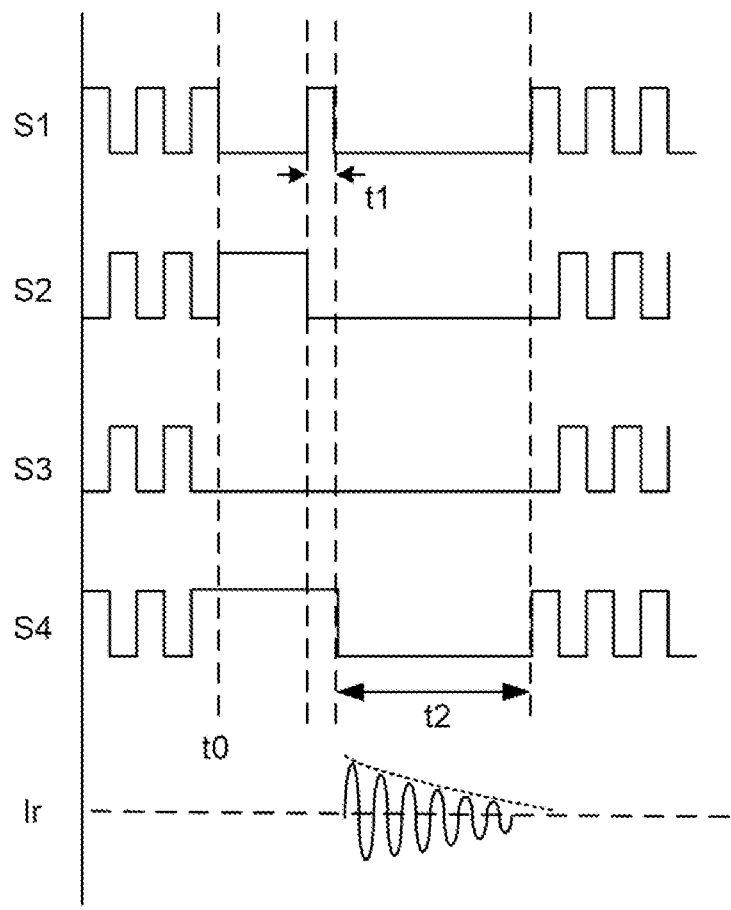
FIG. 6 is the control signals from the controller 410 of FIG. 4 according to an embodiment.

Referring now to FIG. 6 which shows signal sequence diagrams of the control signals applying from the controller 410 to the switches S1 to S4 according to the present disclosure. According to the embodiment, the controller 410 controls the first through fourth switches S1 to S4 to place the wireless charger 400 in a wireless charging phase before time t0. It can be seen from FIG. 6 that during the wireless charging phase, the switches S1 and S2 are alternately closed, and the switches S3 and S4 are alternately closed, to provide PWM signal to the resonant tank circuit 408. Starting from time t0, the wireless charger 400 enters a Q-factor determination phase: to determine the Q-factor, an exciting current is issued by closing the first switch S1 and the fourth switch S4 for a time period t1 which is no longer than the switch-on time of the switches in each cycle of the wireless charging phase.

Figure 7:
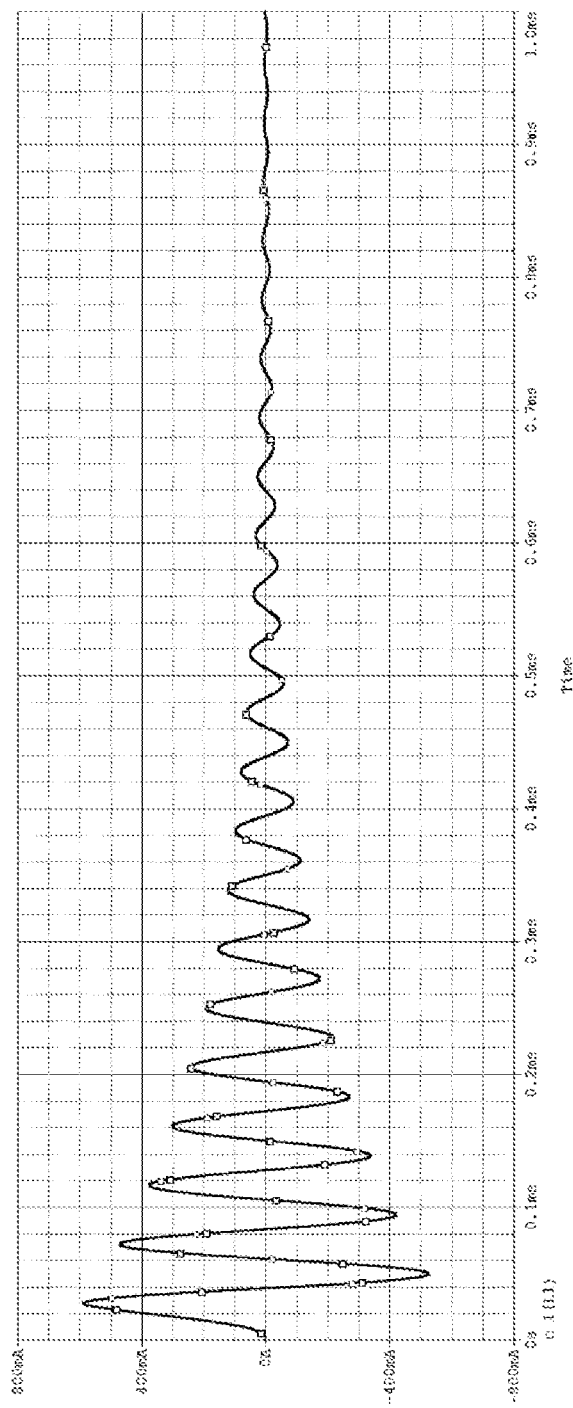
FIG. 7 is a current wave form of the inductor coil of FIG. 4 in the Q-factor determination phase, wherein the switches are controlled by the control signals of FIG. 6.

After the exciting current, also referred to as a current pulse, is issued, all of the switches S1, S2, S3, and S4 are open for a time period t2. It can hereby be clear that because all switches are open, the inductor coil L3, the capacitor C2 of the resonant tank circuit 408, and the capacitor C1 of the filter 406 connect into a resonance network which starts resonating as triggered by the exciting current. The resonance network includes only the inductor coil L3, the capacitor C2 and the capacitor C1, which reduces the resonant elements inductors L1 and L2 from the resonance network, and removes the additional poles from the resonant signal. The simplified resonance network results in a simplified and clear resonant current $I_r$ as shown in FIG. 6, and depicted in more details in FIG. 7, and makes it easier to determine the Q-factor.

Figure 8:
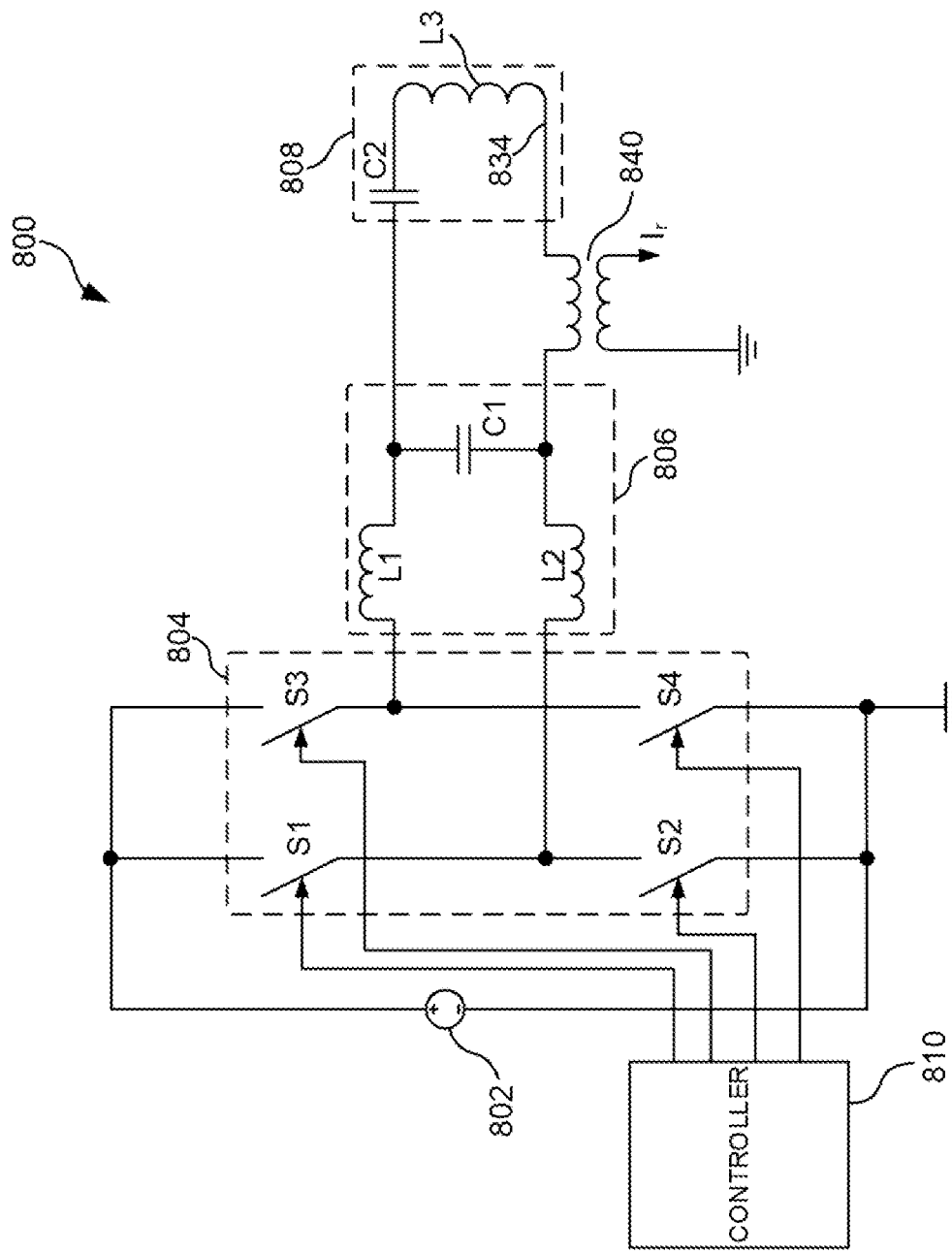
FIG. 8 is a circuit diagram of a wireless charger according to another embodiment, wherein the wireless charger includes a current sensor.

FIG. 8 is a circuit diagram of a wireless charger 800 according to an embodiment of the present disclosure. Similar to the wireless charger 400 of FIG. 4, the wireless charger 800 of FIG. 8 includes a voltage supply 802, an inverter 804, a filter 806, a resonant tank circuit 808, and a controller 810, etc., all of which are similarly referred and labelled, and will not be described in detail herein. In addition to those, the wireless charger 800 includes a current sensor 840 coupled between the second terminal 834 of the third inductor coil L3 of the resonant tank circuit 808 and the capacitor C1 of the filter 806. Accordingly, the current sensor 840, the inductor coil L3, and the capacitor C2 of the resonant tank circuit 808 are series connected. The current sensor 840 provides an output current $I_r$ which is indicative of the current flowing through the third inductor coil L3. It is understood that, the output current $I_r$ is indicative of the above-mentioned voltage $V_r$, and can be further used for calculating the Q-factor by known equations and/or functions. In the embodiment depicted in FIG. 8, the current sensor 840 is a current transformer (CT) with a winding ratio of for example 1:100, wherein the primary windings of the CT 840 are coupled in the resonant tank circuit 808, and the second windings of the CT 840 are coupled to provide the output current $I_r$. As can be understand, the primary windings part of the current sensor 840 coupled into the wireless charger 800 is nearly a pure conductor, and almost introduces no pole into the resonant network.

During normal power transfer period (wireless charging phase), a power loss between a transmitted power from the wireless charger 800 and a received power by the receiver device is often used for determining if a foreign object is present within the charging area. The broadcasting power from the wireless charger 800 can also be calculated through the current $I_r$ which is detected through the current sensor 840. Accordingly, coupling the current sensor 840 into the wireless charger 800 further contributes in determining the power loss, and in the foreign object detection (FOD) during the power transfer period.

The use of the terms "a" and "an" and "the" and similar referents in the context of describing the subject matter (particularly in the context of the following claims) are to be construed to cover both the singular and the plural, unless otherwise indicated herein or clearly contradicted by context. The terms "coupled" and "connected" both mean that there is an electrical connection between the elements being coupled or connected, and neither implies that there are no intervening elements. In describing transistors and connections thereto, the terms gate, drain and source are used interchangeably with the terms "gate terminal", "drain terminal" and "source terminal". Recitation of ranges of values herein are intended merely to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A method for determining a quality factor of a wireless charger, wherein the wireless charger comprises an inverter configured to receive a supply voltage and generate a PWM signal by switching first, second, third, and fourth switches of the inverter, a filter connected to the inverter and configured to receive the PWM signal and generate a filtered signal, and a resonant tank circuit connected to the filter and configured to receive the filtered signal and provide wireless power to a receiver in a wireless charging phase of the wireless charger, wherein the method comprises:
   controlling the first, second, third, and fourth switches to place the wireless charger in the wireless charging phase before entering a Q-factor determination phase of the wireless charger;
   entering the Q-factor determination phase; and
   while in the Q-factor determination phase, stopping switching of the first, second, third, and fourth switches, followed by issuing a single current pulse to the resonant tank circuit by closing one of the first and the second switches, and immediately after issuing the single current pulse, opening the first to fourth switches for a remaining duration of the Q-factor determination phase prior to controlling the first, second, third, and fourth switches to alternately close the first and second switches and alternately close the third and fourth switches.

2. The method of claim 1, further comprising: connecting the inverter as a full-bridge type inverter by:
series connecting the first switch and the second switch as a first branch;
series connecting the third switch and the fourth switch as a second branch; and
connecting the first branch and the second branch in parallel between a voltage supply and ground.

3. The method of claim 2, further comprising:
receiving the supply voltage from the voltage supply, alternately closing the first and second switches and alternately closing the third and fourth switches; and
providing the PWM signal at a first node between the first switch and the second switch, and a second node between the third switch and the fourth switch.

4. The method of claim 1, further comprising:
connecting the filter as a PI filter by:
connecting a first terminal of an inductor to the inverter to receive the PWM signal; and
connecting a capacitor to a second terminal of the inductor; wherein the filtered signal is provided across the capacitor.

5. The method of claim 4, further comprising:
connecting a first terminal of an additional inductor to the inverter; and
connecting a second terminal of the additional inductor to the capacitor, wherein the inductor and the additional inductor are connected to opposite sides of the capacitor.

6. The method of claim 4, further comprising:
connecting the resonant tank circuit across the capacitor of the filter to connect the resonant tank circuit to the filter by:
providing an inductor coil to provide the wireless power;
connecting a capacitor between a first terminal of the inductor coil of the resonant tank circuit and the capacitor of the filter; and
connecting a second terminal of the inductor coil to the capacitor of the filter.

7. The method of claim 4, further comprising:
connecting the resonant tank circuit and the capacitor of the filter into a resonance network by opening the first to fourth switches in the Q-factor determination phase of the wireless charger.

8. A method for determining a quality factor of a wireless charger, wherein the wireless charger comprises:
an inverter comprising first, second, third, and fourth switches configured to receive a supply voltage and generate a PWM signal at a first node and a second node;
a filter connected to the first and second nodes of the inverter to receive the PWM signal and generate a filtered signal at a first terminal and a second terminal of a capacitor; and
a resonant tank circuit connected to the first and second terminals of the capacitor of the filter to receive the filtered signal, and configured to provide wireless power at an inductor coil to a receiver; and wherein the method comprises:
controlling the first, second, third, and fourth switches to place the wireless charger in the wireless charging phase before entering a Q-factor determination phase of the wireless charger;
entering the Q-factor determination phase;
while in the Q-factor determination phase, stopping switching of the first, second, third, and fourth switches followed by issuing a single current pulse to the resonant tank circuit by closing one of the first and the second switches; and
in the Q-factor determination phase of the wireless charger, immediately after issuing the single current pulse, connecting the resonant tank circuit and only the capacitor of the filter in a resonance network.

9. The method of claim 8, further comprising:
connecting the inverter as a full-bridge type inverter by connecting a first branch comprising series connected first and second switches and a second branch comprising series connected third and fourth switches in parallel between the voltage supply and ground;
closing one the first and second switches and closing one of the third and fourth switches to provide the current pulse at the first node between the first switch and the second switch and the second node between the third switch and the fourth switch; and
opening the first to fourth switches of the inverter in the Q-factor determination phase of the wireless charger to connect the resonant tank circuit and only the capacitor of the filter in the resonance network.

10. The method of claim 8, further comprising:
connecting the filter as a PI filter by:
connecting a first terminal of an inductor to the first node of the inverter to receive the PWM signal; and
connecting the capacitor to a second terminal of the inductor.

11. The method of claim 8, further comprising:
series connecting an inductor coil and a capacitor across the capacitor of the filter to connect the resonant tank circuit to the first and second terminals of the capacitor of the filter to receive the filtered signal, wherein the capacitor of the resonant tank circuit is connected between the inductor coil and the capacitor of the filter; and
series connecting the inductor coil and the capacitor of the resonant tank circuit with a current sensor, wherein the current sensor is configured to generate a current signal indicative of a current flowing through the inductor coil.

12. A wireless charger, comprising:
an inverter configured to receive a supply voltage from a voltage supply and generate a PWM signal; wherein the inverter comprises a first branch and a second branch that are connected in parallel between the voltage supply and ground; and
wherein the first branch comprises first and second series connected switches, the second branch comprises third and fourth series connected switches;
a filter connected to the inverter to receive the PWM signal, and is configured to generate a filtered signal, wherein the filter comprises a capacitor and an inductor connected to the capacitor;
a resonant tank circuit connected across the capacitor of the filter to receive the filtered signal, wherein the resonant tank circuit is configured to provide wireless power to a receiver located within a charging area of the wireless charger in a wireless charging phase; and
a controller connected to the first to fourth switches of the inverter, and is configured to:

control the first, second, third, and fourth switches to place the wireless charger in the wireless charging phase before entering a Q-factor determination phase of the wireless charger;

entering the Q-factor determination phase;

while in the Q-factor determination phase, stopping switching of the first to fourth switches followed by issuing a single current pulse to the resonant tank circuit by closing one of the first and the second switches, to issue the single current pulse; and immediately after issuing the single current pulse, open the first to fourth switches for a remaining duration of the Q-factor determination phase of the wireless charger.

13. The wireless charger of claim 12, wherein the inverter is configured to provide the PWM signal at a first node between the first switch and the second switch, and a second node between the third switch and the fourth switch; and wherein the filter is connected to the first node and the second node of the inverter to receive the PWM signal.

14. The wireless charger of claim 13, wherein the inductor has a first terminal connected to the first node, and a second terminal connected to the capacitor.

15. The wireless charger of claim 13, wherein the filter comprises an additional inductor having a first terminal connected to the second node and a second terminal connected to the capacitor.

16. The wireless charger of claim 15, wherein the inductor and the additional inductor are connected to opposite sides of the capacitor.

17. The wireless charger of claim 12, wherein the resonant tank circuit comprises an inductor coil and a capacitor that are series connected, and wherein the inductor coil is configured to provide the wireless power.

18. The wireless charger of claim 17, further comprising a current sensor to generate a current signal indicative of a current flowing through the inductor coil, wherein the current sensor, the inductor coil, and the capacitor of the resonant tank circuit are series connected.

19. The wireless charger of claim 12, wherein the controller is configured to alternately close the first and second switches, and alternately close the third and fourth switches, to generate the PWM signal.

20. The wireless charger of claim 12, wherein a resonance network comprising the resonant tank circuit and the capacitor of the filter is triggered by the issued current pulse to resonate during the Q-factor determination phase when the first to fourth switches are open.

\* \* \* \* \*